(12) United States Patent
Burr et al.

(10) Patent No.: US 7,456,460 B2
(45) Date of Patent: Nov. 25, 2008

(54) PHASE CHANGE MEMORY ELEMENT AND METHOD OF MAKING THE SAME

(75) Inventors: Geoffrey W. Burr, Cupertino, CA (US); Yi-Chou Chen, HsinChu (TW); Hsiang-Lan Lung, Elmsford, NY (US)

(73) Assignees: International Business Machines Corporation, Armonk, NY (US); Macronix International Co., Ltd., Hsinchu (TW)

( * ) Notice: Subject to any disclaimer, the term of this patent is extended or adjusted under 35 U.S.C. 154(b) by 107 days.

(21) Appl. No.: 11/668,208

(22) Filed: Jan. 29, 2007

(65) Prior Publication Data

US 2008/0179582 A1 Jul. 31, 2008

(51) Int. Cl.
*H01L 27/108* (2006.01)
(52) U.S. Cl. .............................. 257/298; 257/E27.078
(58) Field of Classification Search ................. 257/214, 257/298, 2, E27.078
See application file for complete search history.

(56) References Cited

U.S. PATENT DOCUMENTS

| 4,630,355 A | 12/1986 | Johnson |
| 4,845,533 A | 7/1989 | Pryor et al. |
| 6,839,263 B2 | 1/2005 | Fricke et al. |
| 6,869,883 B2 | 3/2005 | Chiang et al. |
| 7,205,562 B2 * | 4/2007 | Wicker .......................... 257/2 |
| 7,217,945 B2 * | 5/2007 | Dennison et al. ................ 257/4 |
| 2004/0134975 A1 | 7/2004 | Goenka et al. |
| 2004/0256694 A1 | 12/2004 | Kostylev et al. |
| 2005/0167645 A1 | 8/2005 | Kim et al. |
| 2005/0194620 A1 | 9/2005 | Dennison et al. |
| 2005/0199420 A1 | 9/2005 | Ishimaru et al. |
| 2006/0001016 A1 | 1/2006 | Dennison |

* cited by examiner

*Primary Examiner*—Wai-Sing Louie
*Assistant Examiner*—Bilkis Jahan
(74) *Attorney, Agent, or Firm*—Cantor Colburn LLP

(57) ABSTRACT

Thin-film phase-change memories having small phase-change switching volume formed by overlapping thing films. Exemplary embodiments include a phase-change memory element, including a first phase change layer having a resistance, a second phase change layer having a resistance, an insulating layer disposed between the first and second phase change layers; and a third phase change layer having a resistance, and coupled to each of the first and second phase change layers, bridging the insulating layer and electrically coupling the first and second phase change layers, wherein the resistance of the third phase change layer is greater than both the resistance of the first phase change layer and the second phase change layer.

2 Claims, 15 Drawing Sheets

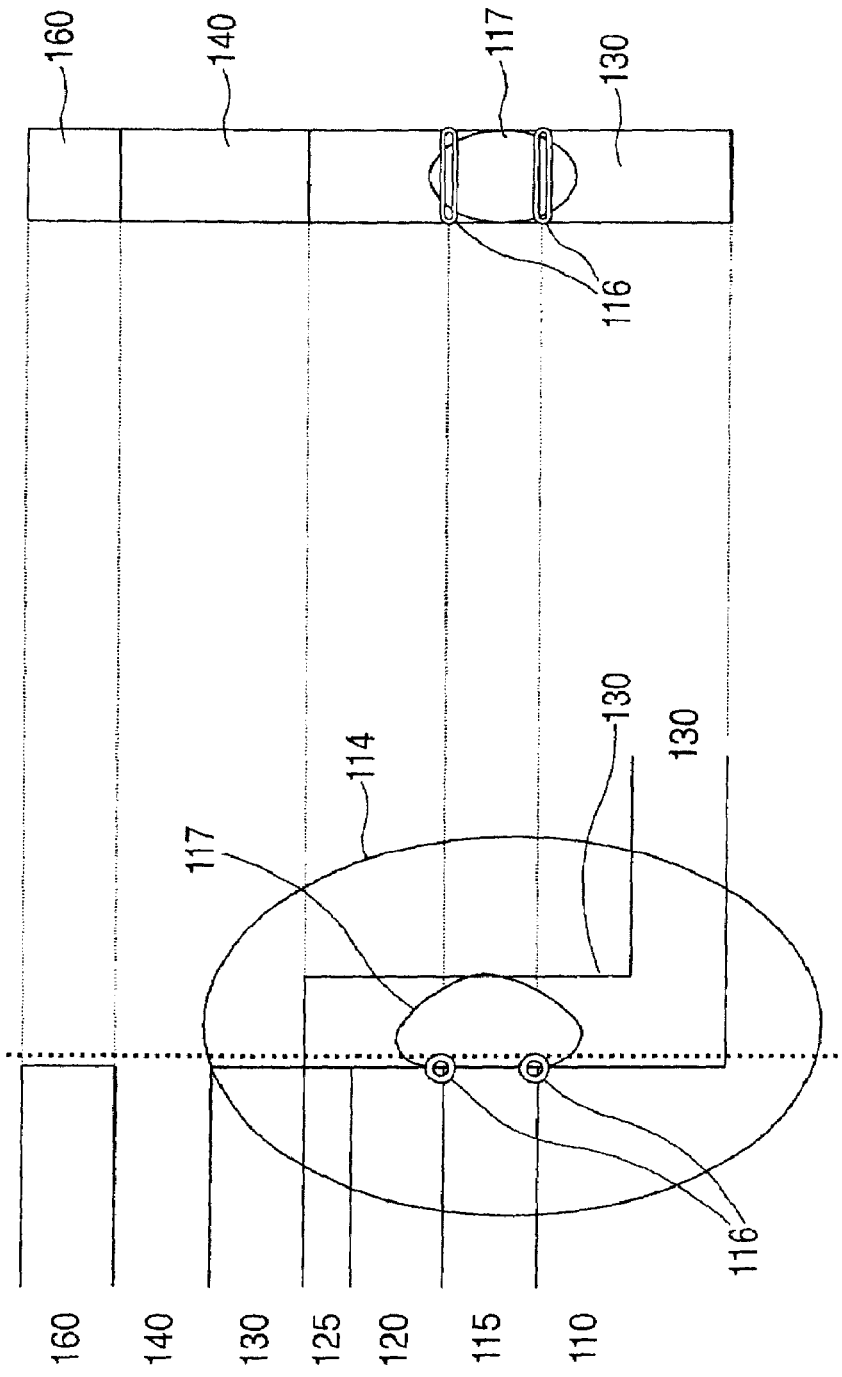

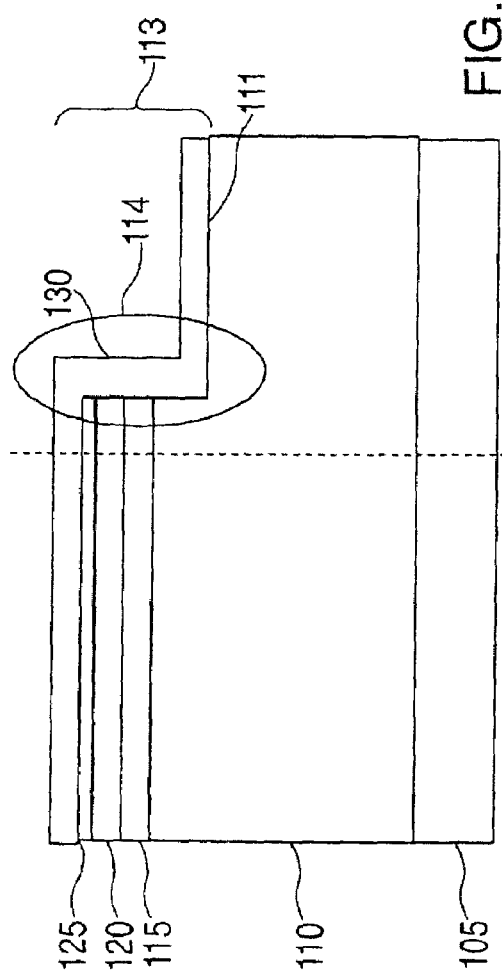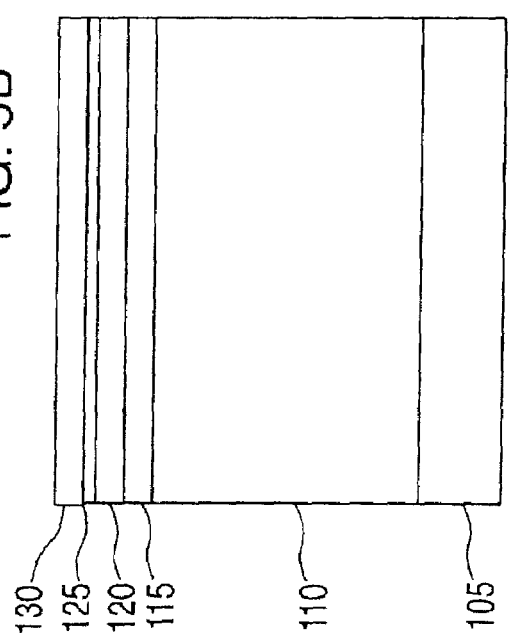

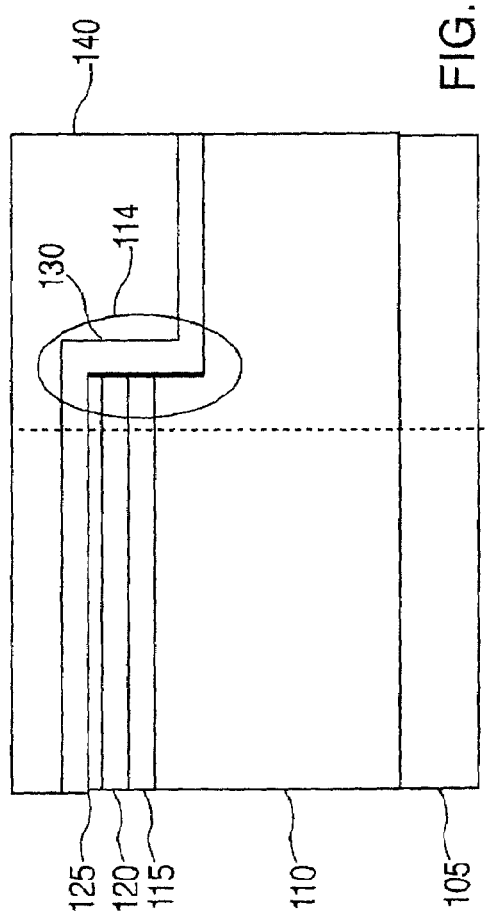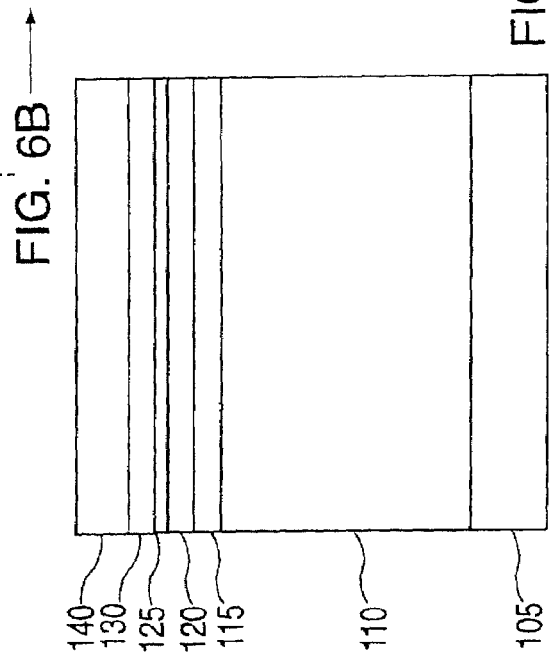

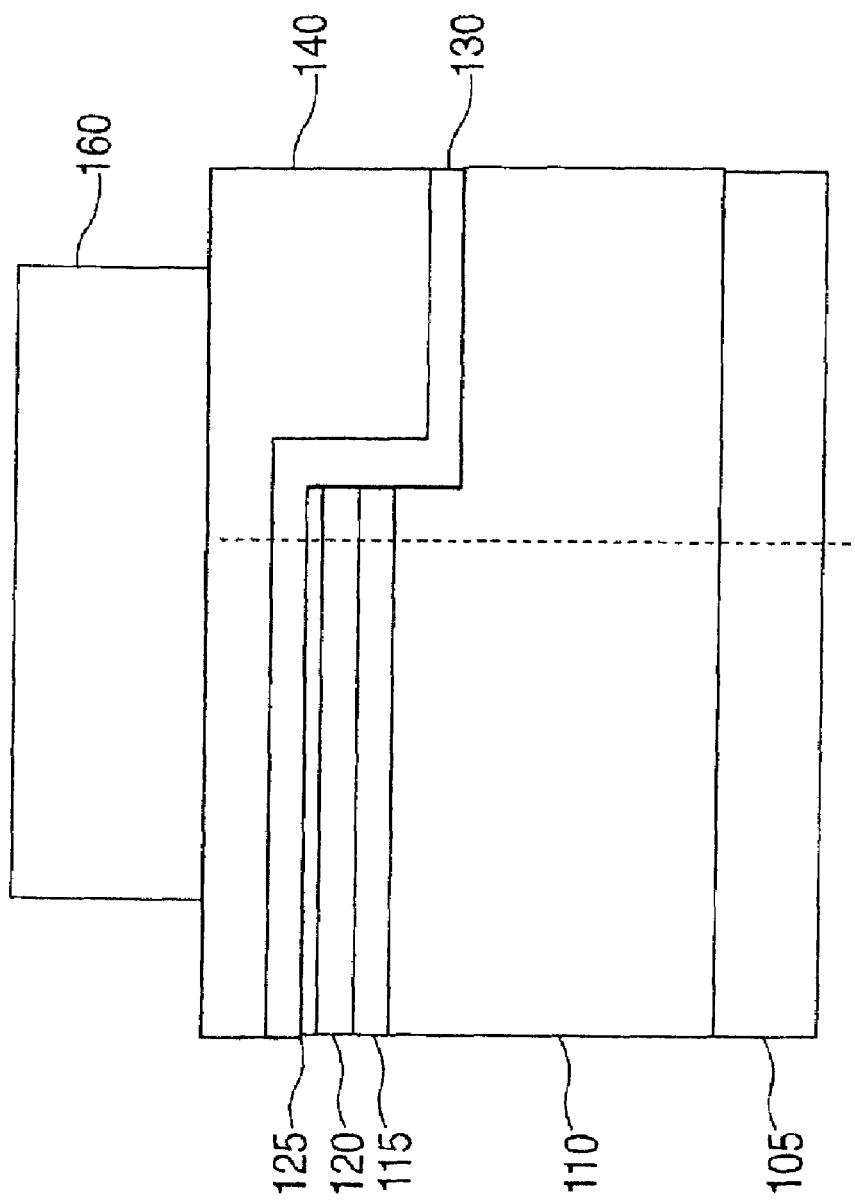

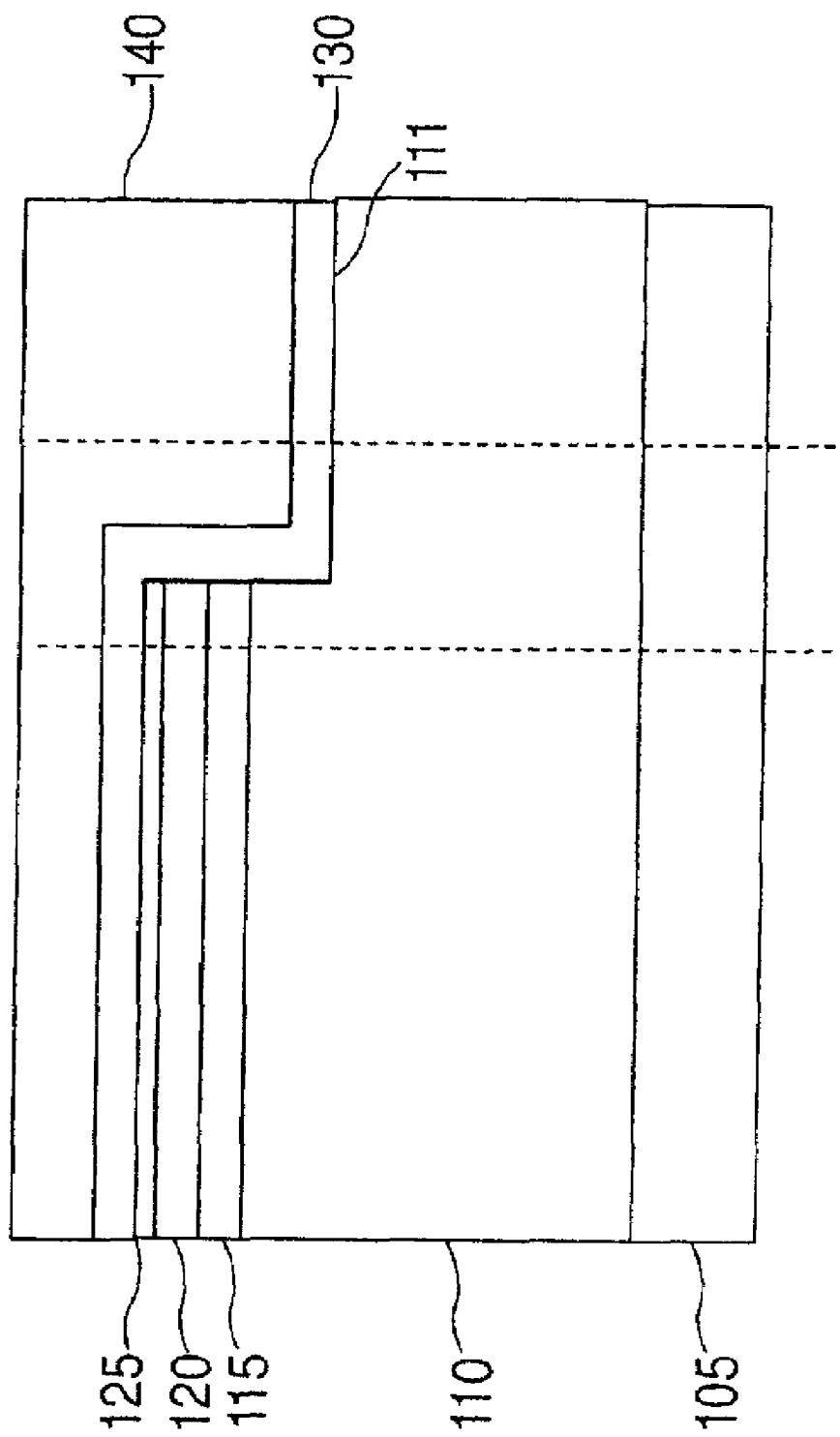

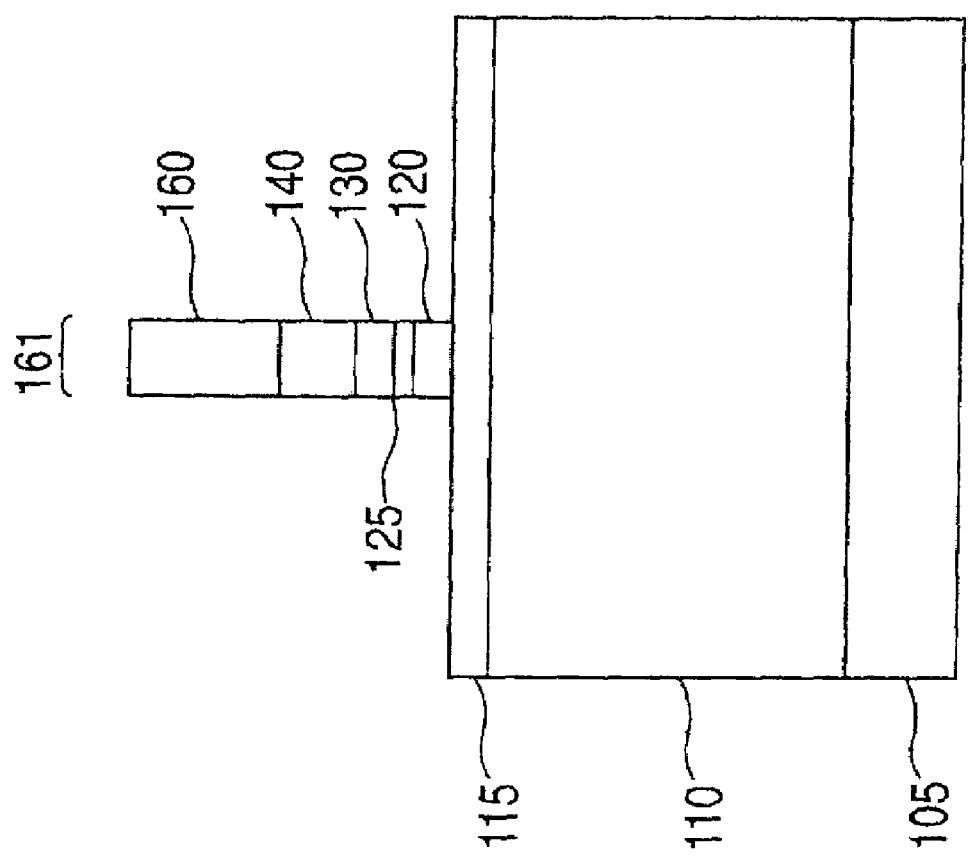

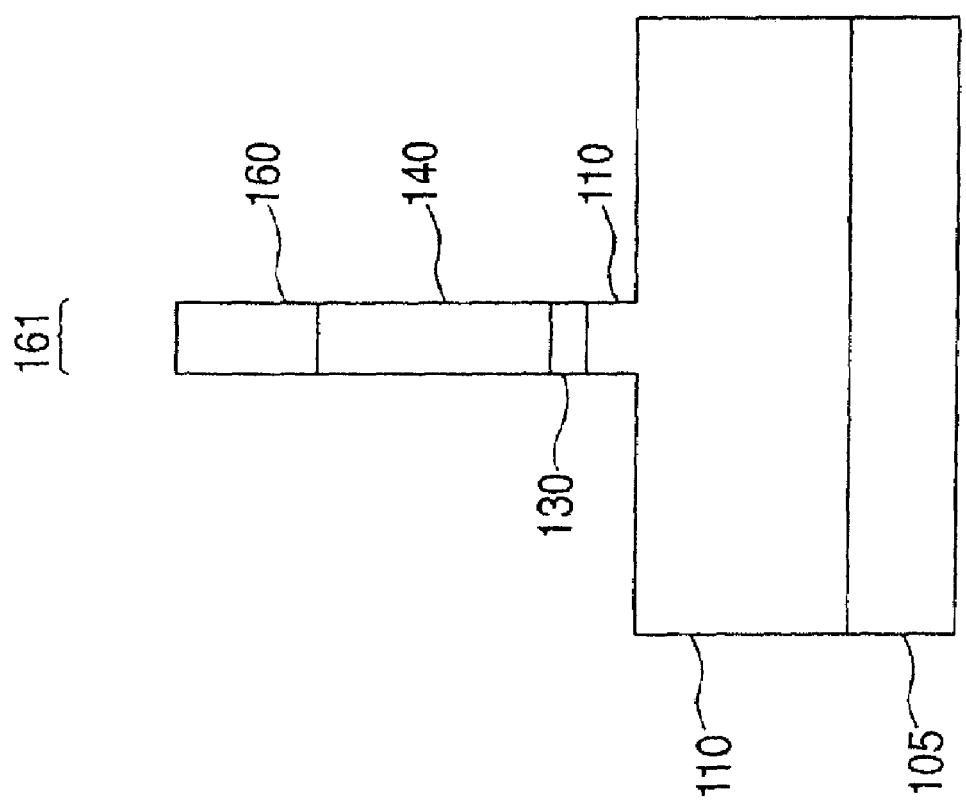

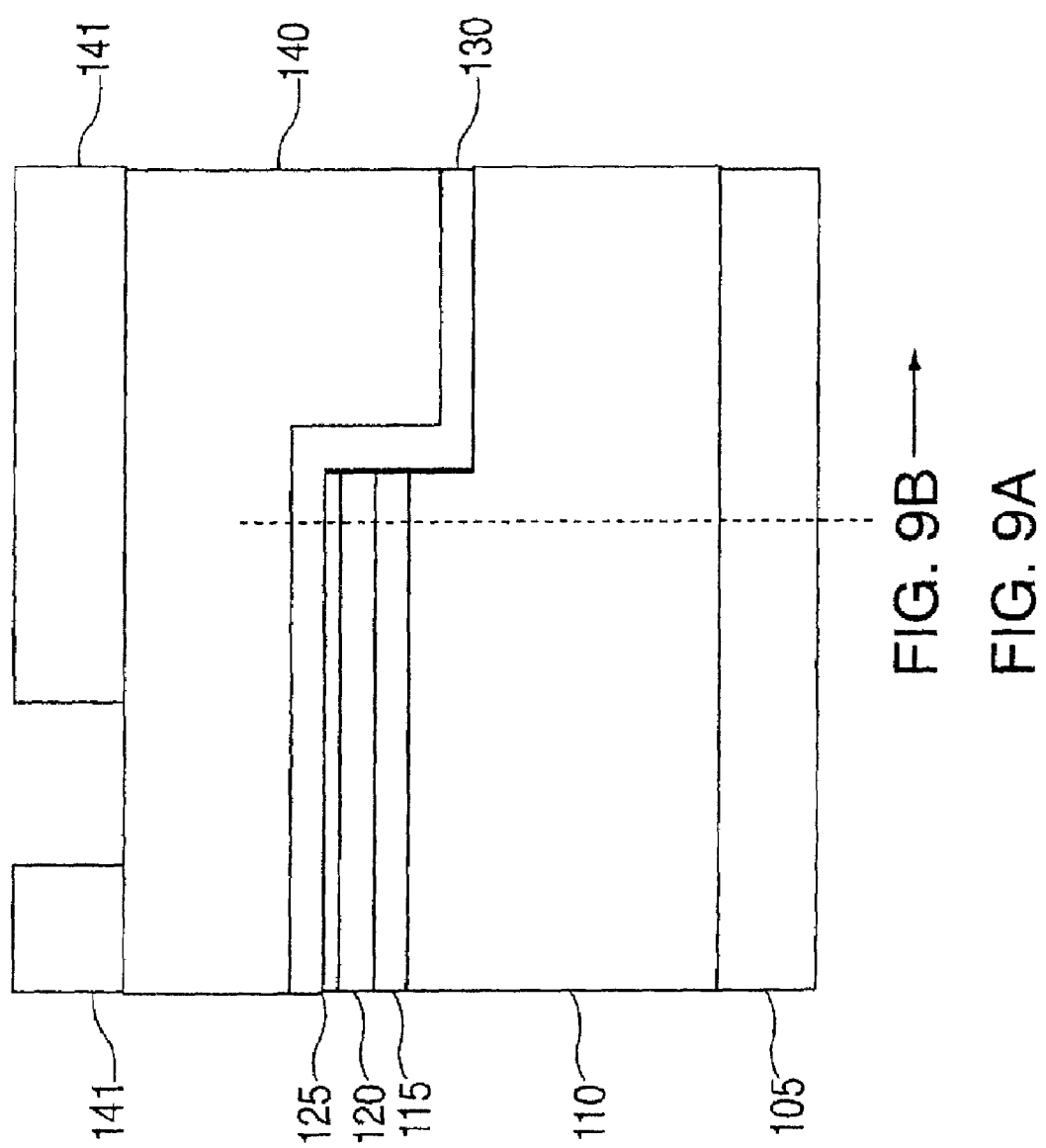

PHASE CHANGE MEMORY ELEMENT AND METHOD OF MAKING THE SAME

TRADEMARKS

IBM® is a registered trademark of International Business Machines Corporation, Armonk, N.Y., U.S.A. Other names used herein may be registered trademarks, trademarks or produce names of International Business Machines Corporation or other companies.

BACKGROUND OF THE INVENTION

Field of the Invention

This invention relates generally to thin-film phase-change memories, and in particular to a small phase-change switching volume formed by overlapping thing films.

Phase-change memory devices use phase-change materials, i.e., materials that may be electrically switched between a generally amorphous and a generally crystalline state, as an electronic memory. One type of memory element utilizes a phase-change material that may be, in one application, electrically switched between generally amorphous and generally crystalline local orders or between different detectable states of local order across the entire spectrum between completely amorphous and completely crystalline states.

Typical materials suitable for such an application include various chalcogenide elements. The state of the phase-change materials is also non-volatile. When the memory is set in either a crystalline, semi-crystalline, amorphous, or semi-amorphous state representing a resistance or threshold voltage ($V_t$) value, that value is retained until reprogrammed, even if power is removed. This is because the programmed value represents a phase or physical state of the material (e.g., crystalline or amorphous).

Typically one of the limiting factors in the density with which such a non-volatile memory can be fabricated is not the size of the programmable phase-change element, but instead the size of the access transistor or other access device co-located with each phase-change memory element. This problem stems from the scaling of the maximum current supplied by the access device with its size, and thus memory element designs that can reduce the amount of current required for somewhat equivalently, the total power required) in order to switch the phase-change element are key for this technology, Particularly critical is the highest current (power) that is needed to melt the phase-change material during the programming of the high-resistance "RESET" state. In the RESET state, the current path through the phase-change element upon readout is forced to pass through some portion of the phase-change material that is in the amorphous phase, thus leading to high device resistance.

Two paths towards reducing this RESET current are to reduce the cross-sectional volume (or more appropriately, area) of the device that is switched between crystalline and amorphous, and to increase the thermal efficiency, so that most of the electrical power that is injected into the device goes towards melting the phase-change material. Key to this second point is the need to increase the thermal resistance between the switching volume and its surroundings. In particular, the electrodes that deliver current to the device need to have high thermal resistance yet low electrical resistance (because if they were highly resistive, then they themselves would heat up instead of the switching volume, thus requiring a larger total amount of power to be delivered from the access transistor or other access device). Because some current (power) would be "wasted" on heating the internal access electrodes, additional total current (power) would be required in order to successfully RESET the device by melting and quenching a sufficient portion of the phase-change material into the amorphous phase. Here the portion is sufficient if the electrical current passing through the element is forced to go through the amorphous phase of the material, which thus significantly increases the overall resistance of the element, representing a stored binary 1. If the cross-section of the electrical path in the vicinity of the switching junction is only 99% amorphous, then due to the high contrast between the resistivity of the amorphous and crystalline phases, most of the current will pass through the small remaining crystalline filament, thus leading to a lower overall device resistance and a perceived stored binary 0. Thus reducing the cross-section of the electrical path that needs to be blocked, ensuring that most of the electrical energy is injected as heat at this region and is thermally insulated from flowing elsewhere, and establishing a fabrication procedure which makes every memory element as identical as possible, are key goals.

Thus, there is a need for cell designs which combine small switching volume together with electrodes that have a high thermal resistance yet a low electrical resistance.

SUMMARY OF THE INVENTION

Exemplary embodiments include a phase-change memory element, including a first conductive layer having a resistance, a second conductive layer having a resistance, an insulating layer disposed between the first and second conductive layers, and a phase change layer having a resistance, and coupled to each of the first and second conductive layers, bridging the insulating layer and electrically coupling the first and second conductive layers, wherein the resistance of the phase change layer is greater than both the resistance of the first conductive layer and the second conductive layer.

Further exemplary embodiments include a method of manufacturing a phase change memory element, the method including providing first phase change material layer and a second phase change material layer separated by an insulating layer, forming a step in the layers defining a first mesa level having the first and second phase material layers and the insulating layer, and a second step having the first phase change material layer, whereby forming the step exposes a surface disposed between the first and the second levels, the surface defining a cross section of the first and second phase material layers and the insulating layer and conformally defining a third phase change material layer over the first and second levels and on the surface.

Additional exemplary embodiments include a phase change memory element, including a switch junction, a first layer of phase change material, a second layer of phase change material and an insulating layer for electrically and thermally coupling the first and second layers of phase change material, wherein the switch junction electrically couples a portion of the first and second layers of phase change materials.

Additional features and advantages are realized through the techniques of the present invention. Other embodiments and aspects of the invention are described in detail herein and are considered a part of the claimed invention. For a better understanding of the invention with advantages and features, refer to the description and to the drawings.

BRIEF DESCRIPTION OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

FIG. 1B illustrates a cross-sectional view of an exemplary phase change memory element;

FIG. 1C illustrates a cross-sectional view of an exemplary phase change memory element;

FIG. 5 illustrates an intermediate structure during the fabrication process of FIG. 2 in accordance with exemplary embodiments;

FIG. 5B illustrates an intermediate structure during the fabrication process of FIG. 2 in accordance with exemplary embodiments;

FIG. 6A illustrates an intermediate structure during the fabrication process of FIG. 2 in accordance with exemplary embodiments;

FIG. 6B illustrates an intermediate structure during the fabrication process of FIG. 2 in accordance with exemplary embodiments;

FIG. 7A illustrates an intermediate structure during the fabrication process of FIG. 2 in accordance with exemplary embodiments;

FIG. 8A illustrates an intermediate structure during the fabrication process of FIG. 2 in accordance with exemplary embodiments;

FIG. 8B illustrates an intermediate structure during the fabrication process of FIG. 2 in accordance with exemplary embodiments;

FIG. 8C illustrates an intermediate structure during the fabrication process of FIG. 2 in accordance with exemplary embodiments;

FIG. 9A illustrates an intermediate structure during the fabrication process of FIG. 2 in accordance with exemplary embodiments;

Figure 1A:
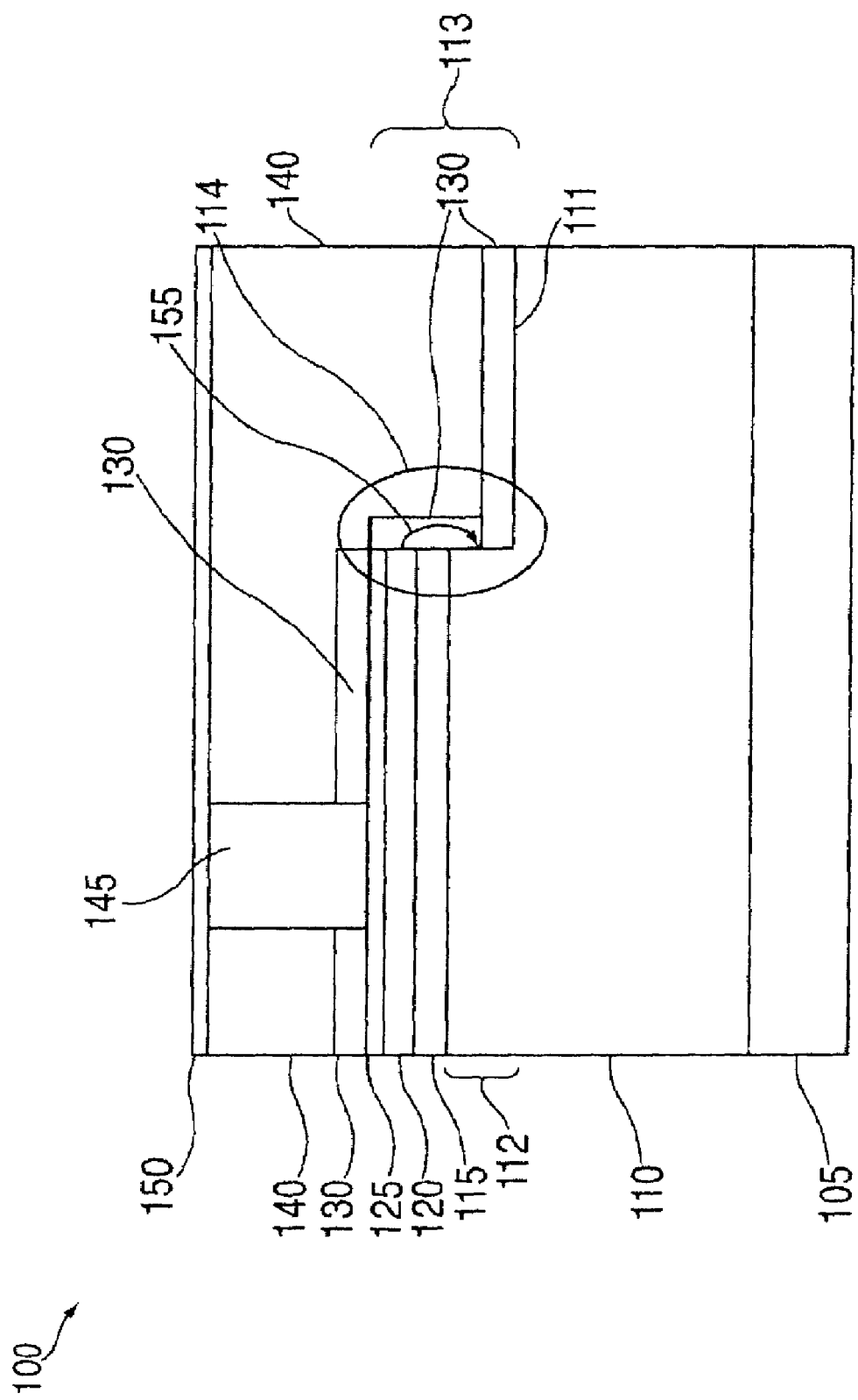
FIG. 1A illustrates a cross-sectional view of an exemplary phase change memory element.

The detailed description explains the preferred embodiments of the invention, together with advantages and features, by way of example with reference to the drawings.

DETAILED DESCRIPTION OF THE INVENTION

The present invention discloses a structure and fabrication procedure for a novel phase-change element in which the size of the switching volume is defined by thin-film processes (thus being unaffected by variations in critical dimension (CD) due to errors in lithography), and in which this switching volume is electrically connected to underlying and overlying metallic vias yet is thermally isolated from these layers.

FIG. 1 illustrates a cross-sectional view of an exemplary phase-change memory element 100. As is appreciated in the description below, the cross section illustrated in FIG. 1 is a phase change junction having a width small compared to the width of element 100. The ability to form a highly repeatable cross-section, which is significantly smaller than the memory element spacing, is needed to reduce the current (power) required to switch the element. The fabrication steps of element 100 are discussed in the description below with respect to FIGS. 2-10. In exemplary embodiments, element 100 includes bottom contact 105, which can be a variety of materials, such as but not limited to titanium nitride (TiN), tungsten (W), etc. It is understood that there are a variety of materials, preferably conductive, which can be implemented to form bottom contact 105. It is further understood that bottom contact 105 is coupled to or is for coupling to a transistor (e.g., coupled to a transistor drain) or another equivalent access device. Therefore, access transistors or other devices have been already fabricated on a silicon or SOI wafer at a desired eventual memory pitch (e.g., 20-50 nm). Furthermore, metallic vias (bottom contact 105) are formed leading down to, for instance, the drain of each access transistor.

Element 100 further includes a first low-resistance phase-change (and conductive) material layer 110 formed on bottom contact 105. The resistivity of the phase-change material, controlled either by doping or by modifying the fabrication conditions, may be advantageously chosen such that the contribution of this layer to the overall device resistance is less than 10%. For instance, if the target device resistance in the SET (all crystalline) state if 10 kOhms, then this first low-resistance phase-change material layer 110 should contribute an overall resistance less than 1 kOhm. In an alternative embodiment, layer 110 can be formed out of any alternative material offering a significant contrast between very high electrical conductivity (>1000 inverse Ohm-cm) and extremely low thermal conductivity (<2 W/K m), even if layer 110 no longer exhibits a phase-change. Layer 110 includes a first mesa level 111 and a second mesa level onto which an insulator layer 115, such as, but not limited to, silicon dioxide ($SiO_2$), silicon oxygen nitride (SiON), silicon nitride (SiN), etc., is formed. Insulator layer 115 is a good electrically and thermally insulating dielectric material. A second low-resistance phase-change (and conductive) material layer 120 is formed on insulator layer 115. Layer 115 can be, for example, <10 nm thick. In exemplary implementation, the materials used for layers 110, 120 are defined by having high thermal resistance and low electrical resistance. It is understood that the low resistance phase change layers can be any material having high electrical conductivity and low thermal conductivity. In an exemplary implementation, etch-stop layer 125 is formed on layer 120. Etch stop layer 125 can be a material such as but not limited to TiN. Etch stop layer 125 has good electrical conducting properties as well as being a material that is able to stop an oxide etch. Therefore, it is appreciated that etch stop layer 125 not only provides good electrically and thermally conducting properties for operation of element 100, but also provides a fabrication features (i.e., etch stop) as discussed further below.

It is appreciated that layers, 115, 120, 125 have been formed on second mesa level 112. A high-resistance phase-change cap layer 130 is formed over both mesa levels 111, 112, over etch-stop layer 125 and layer 110 (i.e., first mesa 111 portions). Layer 130 is also formed over truncated surface 113 defined between mesas 111, 112. Truncated surface 113 can either be perpendicular or angled back so as to improve the contact between layers 130 and layers 110,120. In general, increases in the truncation angle, or increases in the thickness of insulating layer 115, directly increase the active volume of layer 130 through which current flows, leading to an increase in the total switching current (power) required to RESET the memory element by melting. Layer 130 can be a phase-change material capable of switching between an amorphous and a crystalline phase. The resistivity of layer 130 should be chosen, either by doping or control over fabrication conditions, such that it contributes more than 50% (and preferably 80-90%) of the overall device resistance. A resistivity contrast of >30× between the low- and high-resistance phase-change layers can be sufficient. As such, cap layer 130 is deposited over edges of layers 110, 115, 120, 125. It is appreciated that mesa levels 111, 112 and surface 113 define a step (step region or junction 114). It is further appreciated that step region 114 exposes a surface disposed between the first and the second mesa levels 111, 112, the surface defining a cross section of the first and second phase material layers 110, 120 and the insulating layer 115.

Referring still to FIG. 1, it is appreciated that top contact (or via) 145 is formed over a portion of etch-stop layer 125. Element 100 further includes a planar (or cladding) layer 140 formed over layers of both mesas 111, 112 thereby planarizing element 100. Layer 140 can be a dielectric material having a low dielectric constant K and low thermal conductivity such as $SiO_2$. A top conductive layer 150, such as but not limited to TiN, can be formed on top contact 145 and planar layer 140.

In general, the above-described layers are patterned on the pitch of the memory array so as to electrically isolate each memory structure with a dielectric (layer 140) filled in between memory cells.

In general, in element 100, a current 155 flowing in layer 120 flows out of lower film layer 110 on truncated surface 113, and into layer 130 and into upper film layer 120, separated by thin oxide layer 115. As discussed, three layers, 110, 115, 120 are truncated at truncated surface 113, and thin film (higher resistance) cap layer 130 is formed over the truncation surface 113 is order to contact the two layers 110, 120 and define the phase change region through layer 130. Therefore, it is appreciated that step region 114 is a phase change junction switch through which the current 155 flowing through element 100 undergoes a small phase change defined by the thin film thickness layers. As shown in FIGS. 1A, 1B, and 1C, this switching region is formed by the thickness of layer 130, the width of spacer 160, and the thickness of layer 115. Since all three dimensions are formed by thin-film processes, these thicknesses can be made small repeatedly with much higher control than is offered by lithographic definition. Because of the high contrast between the high- and low-resistance phase-change regions, electrical current flows in either the low-resistance phase-change layer 110, 120 or the conductive etch-stop layer 125 except in the immediate vicinity of switching volume 114. Since the resistivity of layer 130 was chosen so that most of the voltage drop occurs in volume 114, most of the electrical power converted to heat through Joule heating is injected within switching volume 114, at the intersection between layer 130 and layers 110 and 120, shown as regions 116. Since the layers 110, 115, 120, 140 in immediate thermal contact with switching volume 114 are chosen to have low thermal conductivity, this injected heat remains in the vicinity and will lead to efficient melting of the phase-change material in the vicinity. Thus the total power needed to melt the entire electrical cross-section in the center of switching volume 114, forming an amorphous plug 117 sufficient to block all current from layer 110 to layer 120, is kept low, and is furthermore made repeatable from memory element to memory element within a memory array.

The use of a much higher resistance cap layer 130, relative to layers 110, 120, allows cap layer 130 to cover all layers on mesa levels 111, 112, and to allow the entire element 100 structure to be trimmed in a third dimension together (discussed in the fabrication steps below), since the volume in which phase change occurs is localized by resistance control rather than by current confinement. Therefore, switching volume 114 is defined by film thicknesses and is largely independent of inaccuracies that can occur in lithography. Since errors in placement of the junction due to lithography do not affect dimensions of switching volume 114, therefore the performance characteristics of element 100 tend to be more uniform from device to device than with conventional cell design. Film thicknesses and etch-back distances in the vicinity of the junction can be controlled with high accuracy, as is expected from semiconductor roadmaps such as ITRS as understood by those skilled in the art.

Figure 2:
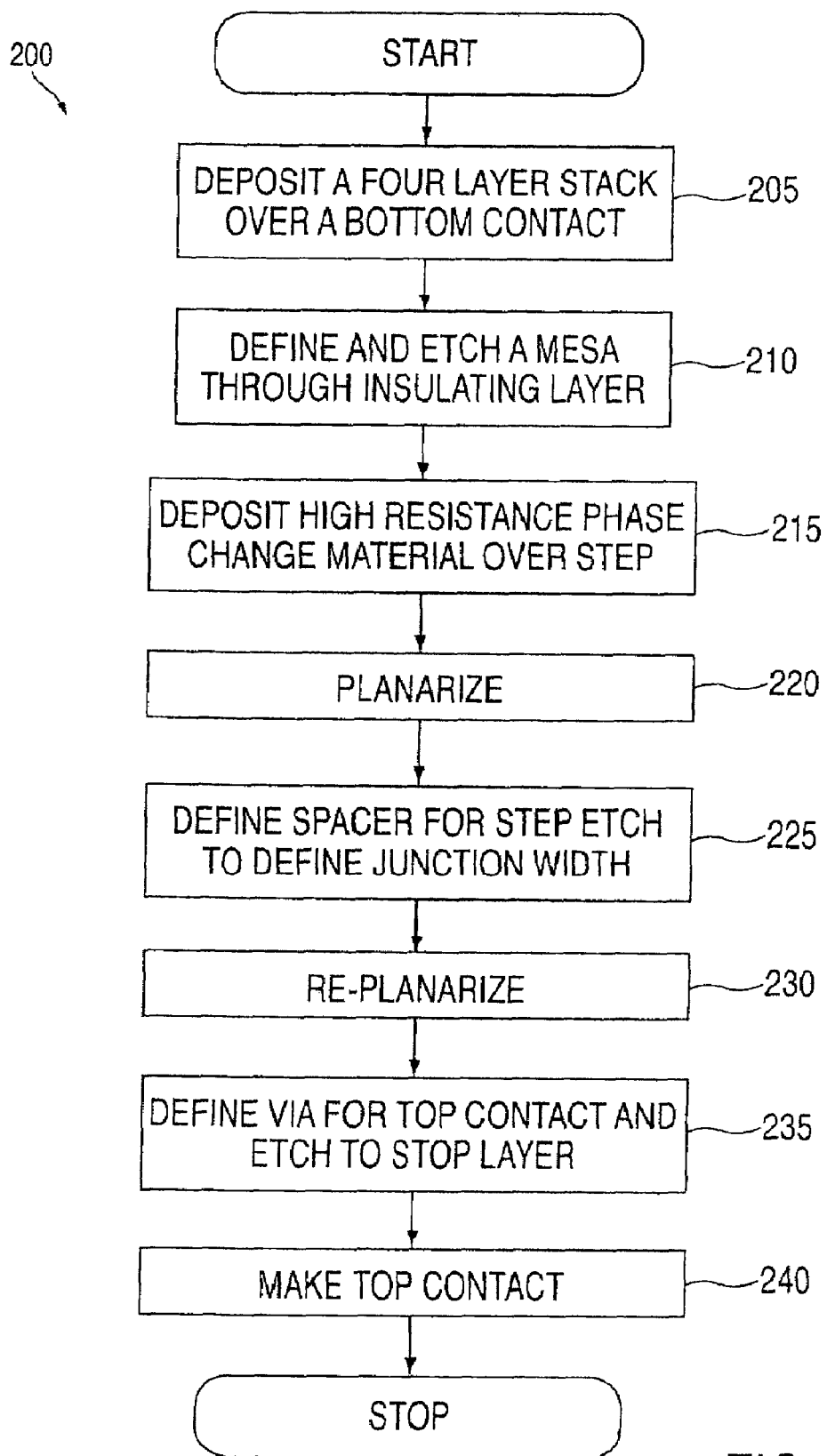
FIG. 2 illustrates a fabrication process in accordance with exemplary embodiments.
Figure 3:
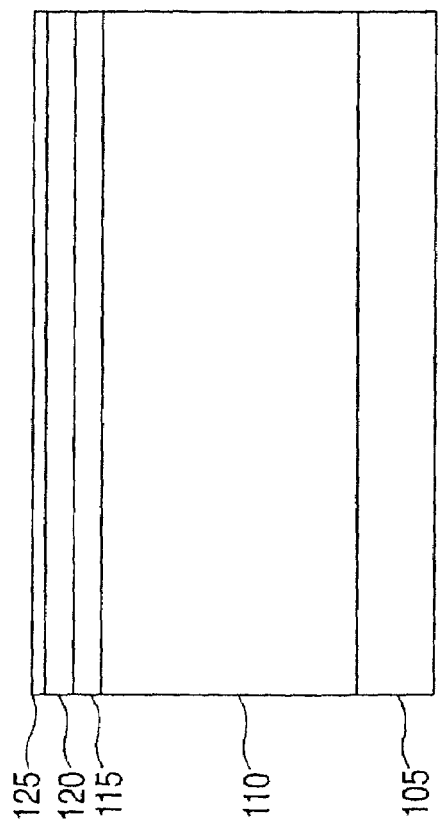
FIG. 3 illustrates an intermediate structure during the fabrication process of FIG. 2 in accordance with exemplary embodiments.

FIG. 2 illustrates a fabrication process 200 in accordance with exemplary embodiments. As discussed above, access transistors or other suitable devices are coupled to bottom contact 105. At step 205, a four layer stack is deposited over the bottom contact 105. The four layer stack includes first low-resistance phase-change material layer 110, insulator layer 115, second low-resistance phase-change material layer 120 and etch-stop layer 125. FIG. 3 illustrates an intermediate structure in accordance with step 205 of process 200; the intermediate structure has a four-layer stack including layers 110, 115, 120, 125 deposited on contact layer 105. As discussed above, layers 110, 115, 120, 125 are patterned lithographically (on the pitch of the memory array, and therefore, coarsely with respect to the dimensions of the eventual switching volume) so as to electrically isolate each memory structure. As discussed further below, a dielectric layer 140 is filled in between memory cells and planarized before the subsequent steps).

Figure 4:
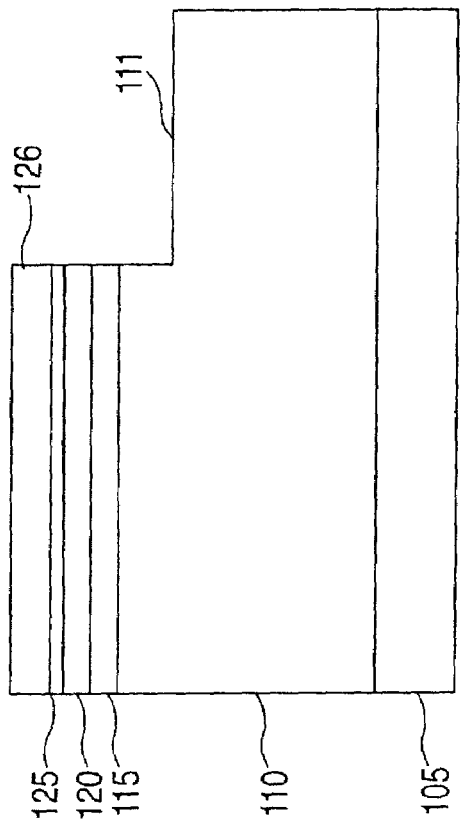
FIG. 4 illustrates an intermediate structure during the fabrication process of FIG. 2 in accordance with exemplary embodiments.

At step 210, a mesa is defined and etched through the insulating layer 115. In general, it is appreciated that by etching through the insulating layer 115, the step further etches into the low resistance layer 110. FIG. 4 illustrates an intermediate structure in accordance with step 210 of process 200. Etching into low resistance layer 110 is controlled by defining a repeatable distance into layer 110. Therefore, the etching progresses through the top three layers 120, 120, 115, as defined by lithographic definition of a protecting photoresist layer 126, which is coated, baked, exposed, developed, etc. in accordance with photolithographic processes known in the art. It is appreciated that errors in the position of this line of developed photoresist 126 can translate the switching volume slightly with respect to the underlying via, but should have negligible impact on performance for reasonable CD variations (e.g., <25% of the memory pitch). As discussed above, the etch is performed through oxide layer 115 and into low-resistance layer 110, although the exact amount etched into the bottom-most low-resistance phase-change layer 110 can be a variety of thicknesses. In exemplary implementations, it is desirable for the distance to be repeatable. It is appreciated that the photoresist layer 126 is appropriately removed in accordance with photolithographic processes known in the art prior to the subsequent step.

At step 215, a conformal high-resistance phase change material layer 130 is deposited over this mesa step region 114, such that good electrical contact is established between high resistance conformal layer 130, and both the upper and lower low-resistance phase-change layers 110, 120 along truncated surface 113. The truncation angle of the truncated surface 113 can be made less perpendicular in order to improve adhesion and electrical contact of layer 130 in this region. However, the choice of truncation angle presents a tradeoff between the repeatability of the conformal electrical contact (e.g., yield) and the RESET current (e.g., performance). FIG. 5A illustrates an intermediate structure in accordance with step 215 of process 200. FIG. 5B illustrates a cross section view of element 100 adjacent junction 114. The resistance of conformal layer 130 can be controlled during deposition by choice of constituents, deposition conditions, doping, etc. The resistivity of layer 130 is chosen, either by doping or by control over fabrication conditions, such that it contributes more than 50% (and preferably 80-90%) of the overall device resistance. A resistivity contrast of >30× between the low- and high-resistance phase-change layers should be sufficient.

At step 220, the element 100 is planarized as preparation for a step-etch that defines a width for junction 114. The mesa structure, that is, mesa levels 111, 112 as well as surface 113, is planarized with a dielectric (e.g., low-K dielectric, silicon dioxide, etc.) FIG. 6A illustrates an intermediate structure in accordance with step 220 of process 200. FIG. 6B illustrates a cross section of the intermediate structure adjacent junction 114. FIGS. 6A and 6B illustrate the intermediate step of step 220 in which dielectric layer 160 is deposited. As discussed above, layer 140 can be a dielectric material having a low dielectric constant K and low thermal conductivity such as $SiO_2$.

Figure 7B:
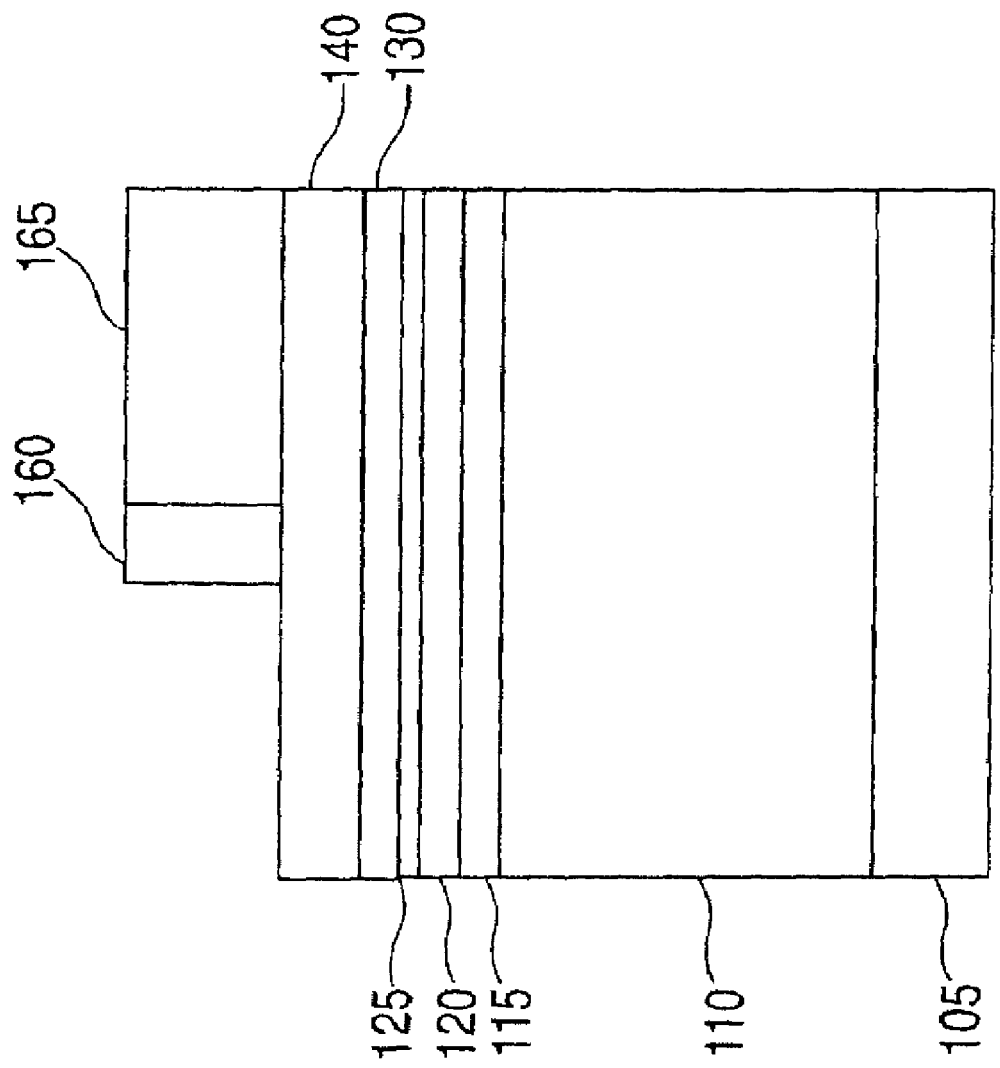
FIG. 7B illustrates an intermediate structure during the fabrication process of FIG. 2 in accordance with exemplary embodiments.

At step 225, a spacer 140 is defined for a step-etch to define the width for junction 114. FIG. 7A illustrates an intermediate structure in accordance with step 225 of process 200. FIG. 7B is a cross section of the intermediate structure adjacent junction 114. As illustrated in FIG. 7B, polysilicon feature 165 with a critical edge lying perpendicular to mesa step, is defined and spacer 160 (e.g., silicon nitride, etc.) is formed at an edge of polysilicon feature 165. This spacer process, as known by those skilled in the art, involves conformally depositing spacer material 160 on top of and on the edges of polysilicon feature 165, and on the flat planarized surface next to feature 165, followed by a removal of the spacer material 160 from all horizontal surfaces using a selective and directional etch (usually a reactive ion etch (RIE)). Then polysilicon feature 165 can be removed, leaving a ring of very thin spacer material 160 standing on the planarized surface, to be used as a subsequent etch mask.

In an exemplary implementation, spacer 160 and polysilicon feature 165 can be formed with a standard spacer process, in which a thin film of silicon nitride is placed everywhere over the polysilicon feature and is then selectively removed from the horizontal surfaces leaving only spacer material 160 on vertical edges of polysilicon features 165. After removing the polysilicon feature 165, an etch is performed using spacer 160 as a mask, which cuts a narrow line, defining the junction 114 width, down into the mesa layers. The etch stops on the original insulator layer 115 on mesa 112 and can over-etch in the regions outside the mesa 112, on mesa 111, and therefore into low resistance layer 110. The depth of the etch into mesa 111, that is layer 110, can vary because it is not proximate junction 114. In general, so long as the contact area (surface 113) for the switching volume (defined where insulating layer 115 contacts high resistance layer 130 at junction 114) is reduced to the width of the spacer, this step is complete. It is understood that the role of the polysilicon feature 165 and spacer 160 can be filled by materials other than polysilicon and nitride, but can also be a pair of materials that support the necessary steps of selective removal and etch protection, such as silicon oxide and silicon oxynitride. It is further appreciated that errors in photolithography shift the position of the switching volume. However, it is the width of spacer 160, defined by thin-film deposition, which dictates the width of the switching volume and thus the memory cell's critical parameters of resistance and required RESET current. The aforementioned features are negligibly affected by errors in photolithography.

FIG. 8A illustrates an intermediate structure in accordance with step 225 of process 200. FIG. 8B illustrates a cross section of mesa 112 adjacent junction 114 of FIG. 8A. This cross-sectional view illustrates the junction width 161 of junction 114. The cross-sectional view further illustrates that the etch step stopped at insulating layer 115, such that the structure includes low resistance layer 120, etch-stop layer 125, high resistance layer 130, dielectric layer 140 and spacer 160, which is removed as discussed above. As is appreciated further with respect to step 235 below, spacer 160 can be retained to protect the eventual contact region used for the via etch at step 235 from definition by the spacer. The retention of spacer 160 keeps the top low-resistance phase-change layer 120 and TiN etch-stop layer 125 wide in this area so that the entire bottom of the via etch at step 235 ends on TiN etch-stop layer 125 (rather than just a strip along the center of the via). FIG. 8C illustrates a cross section of mesa 111 adjacent junction 114. As discussed above, the etch proceeds into low resistance layer 110, such that a small portion of low resistance layer 110 is included in the width 161 of the junction 114. The thin junction 114 further includes high resistance layer 130, dielectric layer 130 and spacer layer 160.

At step 230, the intermediate structure is filled or re-planarized with a low K dielectric material, which can be the same material of layer 140, or other suitable material, such as but not limited to $SiO_2$, as discussed above.

Figure 9B:
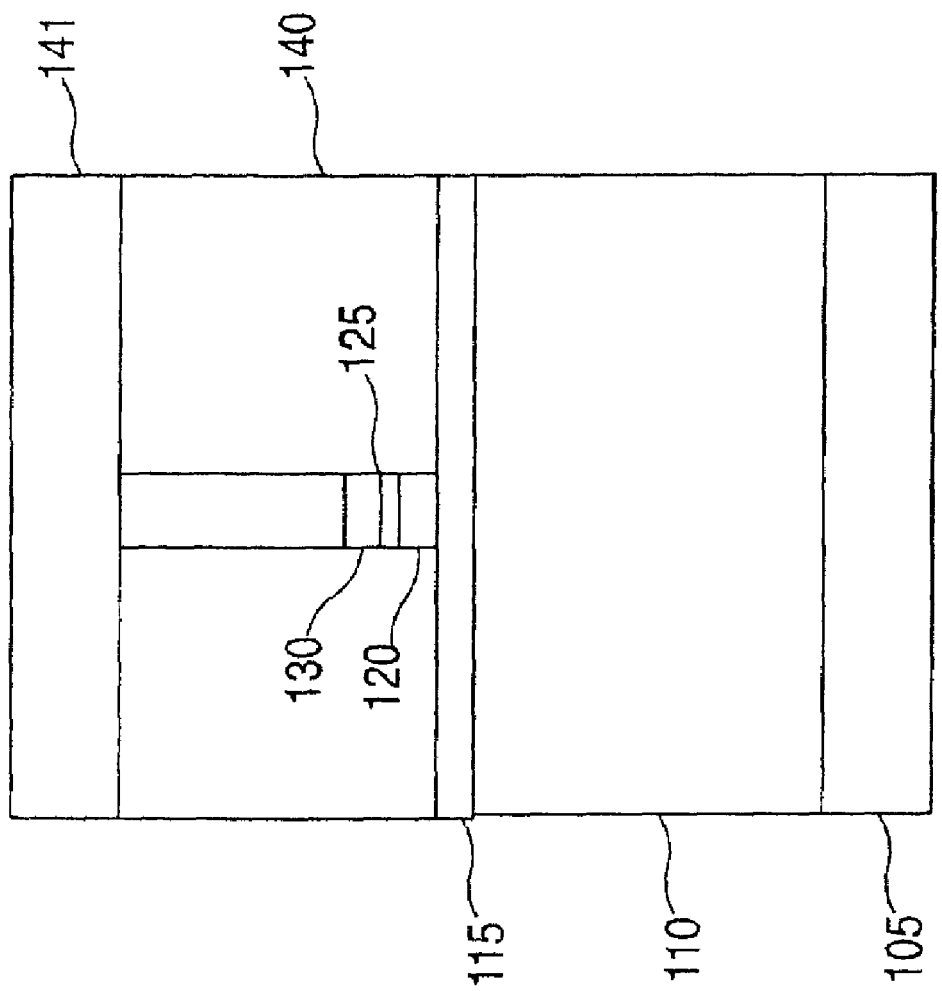
FIG. 9B illustrates an intermediate structure during the fabrication process of FIG. 2 in accordance with exemplary embodiments.
Figure 10:
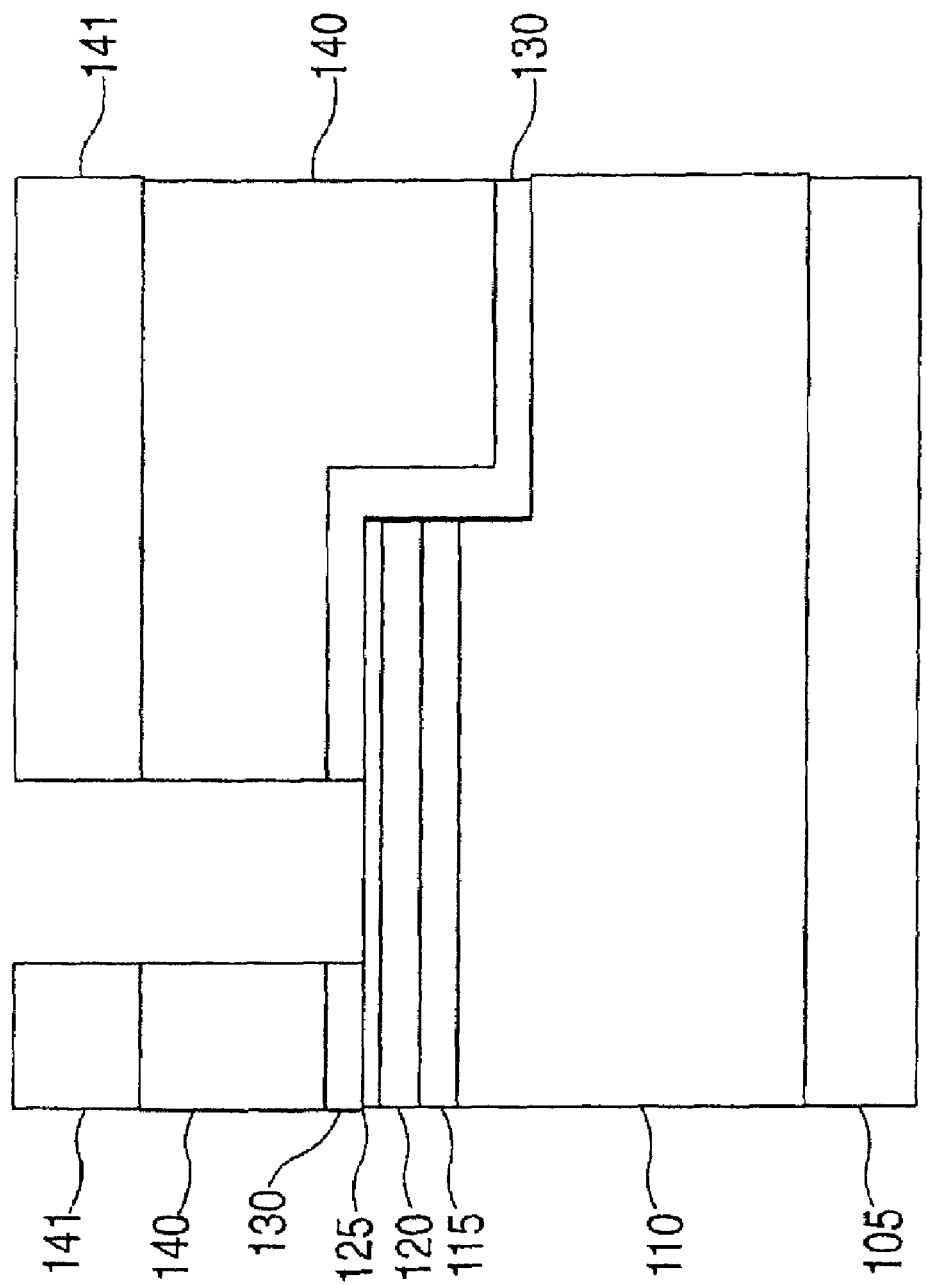
FIG. 10 illustrates an intermediate structure during the fabrication process of FIG. 2 in accordance with exemplary embodiments.

At step 235, a via for top contact 145 is defined and an etch to etch stop layer 125 is performed. FIG. 9A illustrates an intermediate structure in accordance with steps 230, 235 of process 200. FIG. 9B is a cross section of the intermediate structure of FIG. 9A. FIGS. 9A and 9B illustrate the dielectric fill layer 140 added at step 230. After filling with dielectric and re-planarizing (at step 230), a reliable electrical contact to the thin and narrow strip (defined by width 161), which remains of the original top low-resistance phase change material layer 120, is defined. A via along junction line defined by width 161, but away from the switching volume junction 114 is formed. The etching is performed down to the titanium nitride (etch-stop) layer 125, using photolithographic processes known in the art, through resist layer 141. FIG. 10 illustrates an intermediate structure illustrating the etch to the etch-stop layer 125.

The defined via is then refilled with a metal (e.g., aluminum, copper, TiN, etc.) in order to form a via (top contact 145) to connect to subsequent metallization (top contact layer 150). Therefore, it is appreciated that the TiN stop-etch layer 125 deposited as the top layer of the original stack serves here to prevent over-etching of this via down through the insulator layer 115, which would short out the element 100. It is not appreciated, spacer 160 can be retained to protect the eventual contact region used for the via etch at step 235 from definition by the spacer. The retention of spacer 160 keeps the top low-resistance phase-change layer 120 and TiN etch-stop layer 125 wide in this area so that the entire bottom of the via etch at step 235 ends on TiN etch-stop layer 125 (rather than just a stripe along the center of the via).

Figure 11:
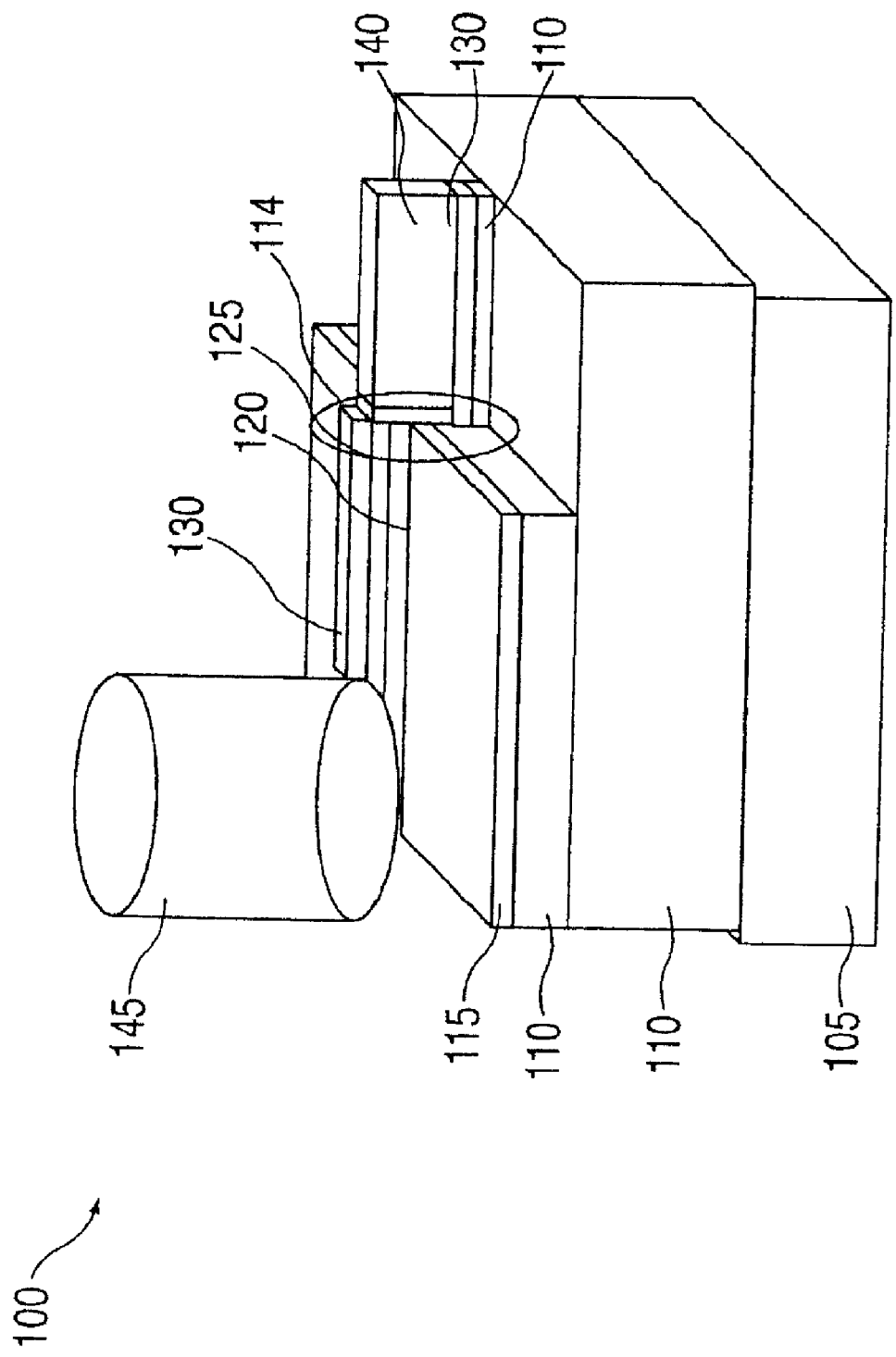
FIG. 11 illustrates a perspective view of the phase change memory element of FIG. 1, with the filling oxide layer removed for illustrative purposes.

Since the TiN stop-etch layer 125 efficiently conducts heat away from the switching volume junction 114, the thickness 161 of the upper low-resistance phase-change layer 120 should not be too small. A thickness greater than 20 nanometers is preferable in order to allow the low thermal conductivity of low-resistance phase-change layer 120 to thermally insulate the switching volume 114. The thickness 161 of layer 120 is selected to balance the heat conduction by the overlying TiN layer against the fabrication difficulty of getting conformal deposition of the high-resistance phase-change layer 130 over a tall mesa step. The resulting element 100 is as illustrated in FIG. 1. FIG. 11 illustrates a perspective view of the phase change memory element 100 of FIG. 1, with the filling oxide layer 140 removed for illustrative purposes. The perspective view illustrates the junction 114 and the overall thin strip as fabricated in accordance with process 200 and the width 161 of the junction 114.

At step 240, the top conducting layer 150 is formed. The remainder of the back-end process, including steps such as connecting metal bit-lines to these metallic vias and completing the peripheral circuits, is performed similar to phase-change memory array processes known in the art.

The flow diagram depicted herein is just an example. There may be many variations to these diagrams or the steps (or operations) described therein without departing from the spirit of the invention. For instance, the steps may be performed in a differing order, or steps may be added, deleted or modified. All of these variations are considered a part of the claimed invention.

While a preferred embodiment to the invention has been described, it will be understood that those skilled in the art, both now and in the future, may make various improvements and enhancements which fall within the scope of the claims which follow. These claims should be construed to maintain the proper protection for the invention first described.

What is claimed is:

1. A phase-change memory element, comprising:
   a first conductive layer having a resistance;
   a second conductive layer having a resistance;
   an insulating layer disposed between the first and second conductive layers; and
   a phase change layer having a resistance, and coupled to each of the first and second phase change layers, bridging the insulating layer and electrically coupling the first and second conductive layers, wherein the first and second conductive layers, the phase change layer, and the insulating layer are disposed on a first level of a mesa step;
   a second level of the mesa step, including a contiguous portion of the first conductive layer, a contiguous portion of the phase layer disposed on the first conductive layer and a dielectric disposed on the phase layer, wherein the first level and the second level of the mesa step are electrically coupled via the junction,
   wherein the resistance of the phase change layer is greater than both the resistance of the first conductive layer and the conductive layer,
   wherein the phase layer is a conformal layer configured as a strip defined contiguously along the first level, the junction, and the second layer,
   wherein the junction defines a phase changing path between the first and second conductive layers.

2. A method of manufacturing a phase change memory element, the method comprising:
   providing first phase change material layer and a second phase change material layer separated by an insulating layer;
   forming a step in the layers defining a first mesa level having the first and second phase material layers and the insulating layer, and a second mesa level having the first phase change material layer, whereby forming the step exposes a surface disposed between the first and the second mesa levels, the surface defining a cross section of the first and second phase material layers and the insulating layer;
   conformally defining a third phase change material layer over the first and second mesa levels and on the surface;
   forming a planar layer of a dielectric material over the first and second mesa levels;
   defining a spacer having a width on the planar dielectric layer;
   etching the layers to the sides of the spacer, whereby the etch stops at the insulating layer on the first level and at the first phase changing material on the second level;
   forming a planar layer of a dielectric material over the first and second mesa levels;
   defining a via through the dielectric material and through the conformal third phase material layer; and
   defining a conductor in the via to the second phase material layer,
   whereby a conductive path is formed between the conductor, the second phase change material layer, the third phase change material layer and the first phase change material layer.

* * * * *